(12) United States Patent
Eason, Jr. et al.

(10) Patent No.: US 6,334,398 B1
(45) Date of Patent: Jan. 1, 2002

(54) VARIABLE GAP STOP WHICH CAN BE USED IN A SEMICONDUCTOR PROCESSING DEVICE

(75) Inventors: James A. Eason, Jr., Peabody; Tom Hamelin, Georgetown; Marty Kent, Andover, all of MA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/560,153

(22) Filed: Apr. 28, 2000

(51) Int. Cl.[7] ................................................. A47B 5/00
(52) U.S. Cl. ........................................................ 108/20
(58) Field of Search ............................... 108/20, 21, 22, 108/147; 74/813 R, 816; 414/782

(56) References Cited

U.S. PATENT DOCUMENTS

| | | | |
|---|---|---|---|
| 4,602,555 A | * | 7/1986 | Bushey ...................... 108/20 X |
| 5,054,991 A | * | 10/1991 | Kato ......................... 108/20 X |
| 5,323,712 A | * | 6/1994 | Kikuiri ........................ 108/20 |
| 5,467,720 A | * | 11/1995 | Korenaga et al. |
| 5,685,232 A | * | 11/1997 | Inoue |
| 5,920,938 A | * | 7/1999 | Iwanaga et al. |
| 6,040,909 A | * | 3/2000 | Hasegawa et al. |
| 6,097,492 A | * | 8/2000 | Kondo et al. .......................... |

* cited by examiner

*Primary Examiner*—Jose V. Chen
(74) *Attorney, Agent, or Firm*—Oblon, Spivak, McClelland, Maier & Neustadt, P.C.

(57) ABSTRACT

A variable gap stop device which can stop the movement of a drive unit, such as a cylinder which moves a chuck on which a semiconductor wafer is secured in a semiconductor processing equipment. The drive unit includes at least one positioning surface. A movable gap stop unit includes at least one stop surface, and in a preferred embodiment may include two or more different stop surfaces each at a different height. A cylinder moves the movable gap stop unit to position at least one of the stop surfaces to be in and out of alignment with the at least one positioning surface of the drive unit. With such a structure and operation, the at least one positioning surface of the drive unit can abut against the variable stop surfaces of the movable gap stop unit. Based on which of the plural stop surfaces the positioning surface of the drive unit abuts against, a height that the drive unit moves the positioning surface can be controlled, e.g. the height that the cylinder moves the chuck and consequently the height of the chuck within a semiconductor processing chamber, can be controlled. Thereby, an easily executable control is provided such that an object, such as a semiconductor wafer, can be easily and efficiently positioned at variable heights within a device, such as a processing chamber.

15 Claims, 6 Drawing Sheets

US 6,334,398 B1

VARIABLE GAP STOP WHICH CAN BE USED IN A SEMICONDUCTOR PROCESSING DEVICE

BACKGROUND OF THE INVENTION

1. Field of the Invention

The present invention is directed to a variable gap stop arrangement for a driving unit which, as one example, moves a semiconductor wafer to a desired height within a semiconductor processing chamber.

2. Discussion of the Background

In the processing of semiconductor wafers, the semiconductor wafers are at various times placed inside a process chamber, a deposition chamber, etc. In those chambers the semiconductor wafers are subjected to different processings.

For example, within an etching processing chamber a semiconductor wafer is placed on a semiconductor support element, such as a chuck which also serves as a lower electrode. Positioned above the chuck is an upper electrode. Further, positioned circumferentially around the chuck and the upper electrode is a rotating magnet. The chuck, the upper electrode, and the rotating magnet generate a plasma used to etch the semiconductor wafer placed on the chuck.

In such an etching processing chamber, the semiconductor wafer must be positioned at a certain distance from the upper electrode. To achieve that operation the chuck on which the semiconductor wafer is mounted is moved up and down within the processing chamber by a drive system to a desired height below the upper electrode.

FIG. 1 shows a background drive system to position a chuck at a desired height in a semiconductor processing chamber. FIG. 1 shows a cylinder 10 on which a chuck (not shown) is mounted, and a semiconductor wafer (not shown) is in turn secured on the chuck.

In FIG. 1, three drive screws 12 are provided which when rotated drive the cylinder 10 up and down. Formed around the three drive screws 12 is a drive chain (not shown) to rotate the three drive screws 12, and the drive chain is in turn is driven by a motor (not shown).

With the drive system of FIG. 1 an operator of the semiconductor processing equipment can set a desired height of a semiconductor wafer within a process chamber. Then, the motor drives the drive chain to in turn drive the three drive screws 12, which in turn move the cylinder 10 to a desired height within a semiconductor processing chamber. Further, various sensors and feedback systems can be employed to monitor the height of the chuck within the processing chamber to ensure that the chuck supports the semiconductor wafer at the desired height. Thus, utilizing the drive system for the cylinder 10 supporting a chuck as shown in FIG. 1 allows a semiconductor wafer to be replaced at a variable height within a processing chamber.

However, the chain drive system of FIG. 1 suffers from several drawbacks for semiconductor processing. First, semiconductor processing requires extremely precise operations and also requires a very high level of cleanliness. The chain drive of FIG. 1 has a drawback in that it often generates vibrations within the semiconductor equipment which may be detrimental to the semiconductor equipment. Further, the chain drive may require lubricants which could result in contaminants finding their way into the semiconductor equipment, and any contaminants in semiconductor equipment may result in contaminating a semiconductor wafer being processed.

An alternative system for positioning a semiconductor support element is shown in FIG. 2. FIG. 2 shows a chuck 21 on which a semiconductor wafer is secured. The chuck 21 in turn is supported by a cylinder 22 which moves up and down to pass through an upper support bracket 27 and a lower support bracket 25. The cylinder 22 also includes a lower base 26 attached thereto to move with the cylinder 22. The cylinder 22 may be a pneumatically air driven cylinder which moves upward and downward based on a control of an airflow, in a standard way.

To ensure that the chuck 21 is at an appropriate height within a processing chamber, the lower base 26 includes three stop screws 24. The stop screws 24 may have an adjustable height, as shown by the shadow line in FIG. 2. When the cylinder 22 is moved upward to move a semiconductor wafer secured on the chuck 21 into a processing chamber, the stop screws 24 will abut against a bottom of the lower support bracket 25 to stop the cylinder 22 at an appropriate position, which as a result stops the chuck 21 at an appropriate height within the processing chamber. An operator of semiconductor equipment including the drive system of FIG. 2 may manually adjust the positioning of the stop screws 24 (as shown by the dashed line in the front shown stop screw 24) to adjust the height at which the chuck 21 stops within the processing chamber. With such a device, the movement of the cylinder 22 is only stopped by the stop screws 24 abutting against the lower support bracket 25.

The benefits of the drive system of FIG. 2 with respect to the drive system of FIG. 1 is that the drive system of FIG. 2 does not require a chain drive and thus avoids the vibration and potential contamination of the chain drive system. A drawback with the drive system of FIG. 2 is that it is more difficult and cumbersome for an operator to adjust the height of the cylinder 22 within the processing chamber since performing such an adjustment requires an operator to manually and properly adjust the position of the stop screws 24.

SUMMARY OF THE INVENTION

One object of the present invention is to provide a novel drive system, which may find particular application in semiconductor processing equipment, which provides the benefits of allowing a height of an object support to be varied.

A further object of the present invention is to provide a novel drive system, which may find particular application in semiconductor processing equipment, which allows a height of an object support to be easily varied by an operator, and without generating vibration and contaminants.

A further object of the present invention is to provide a novel drive system, which may find particular application in semiconductor processing equipment, which can be implemented in semiconductor processing equipment which utilizes a pneumatic cylinder drive unit for driving a chuck on which a semiconductor wafer is placed.

To achieve the above and other objects, the present invention sets forth a novel variable gap stop device which can stop the movement of a drive unit, such as a pneumatically driven cylinder which moves a chuck on which a semiconductor wafer is secured in a semiconductor processing equipment. In the present invention the drive unit includes at least one positioning surface. A movable gap stop unit includes at least one stop surface, and in a preferred embodiment may include two or more different stop surfaces each at a different height. A cylinder with a rod moves the movable gap stop unit to position at least one of the stop surfaces to be in and out of alignment with the at least one positioning surface of the drive unit.

With such a structure and operation in the present invention, the at least one positioning surface of the drive unit can abut against one of the plural stop surfaces of the movable gap stop unit. Based on which of the plural stop surfaces the positioning surface of the drive unit abuts against, a height that the drive unit moves the positioning surface can be controlled, e.g. the height that the cylinder moves the chuck, and consequently the height of the chuck within a semiconductor processing chamber, can be controlled.

Thereby, the structure in the present invention provides an easily executable control such that an object, such as a semiconductor wafer, can be easily and efficiently positioned at variable heights within a device, such as a processing chamber.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENT

Figure 3:
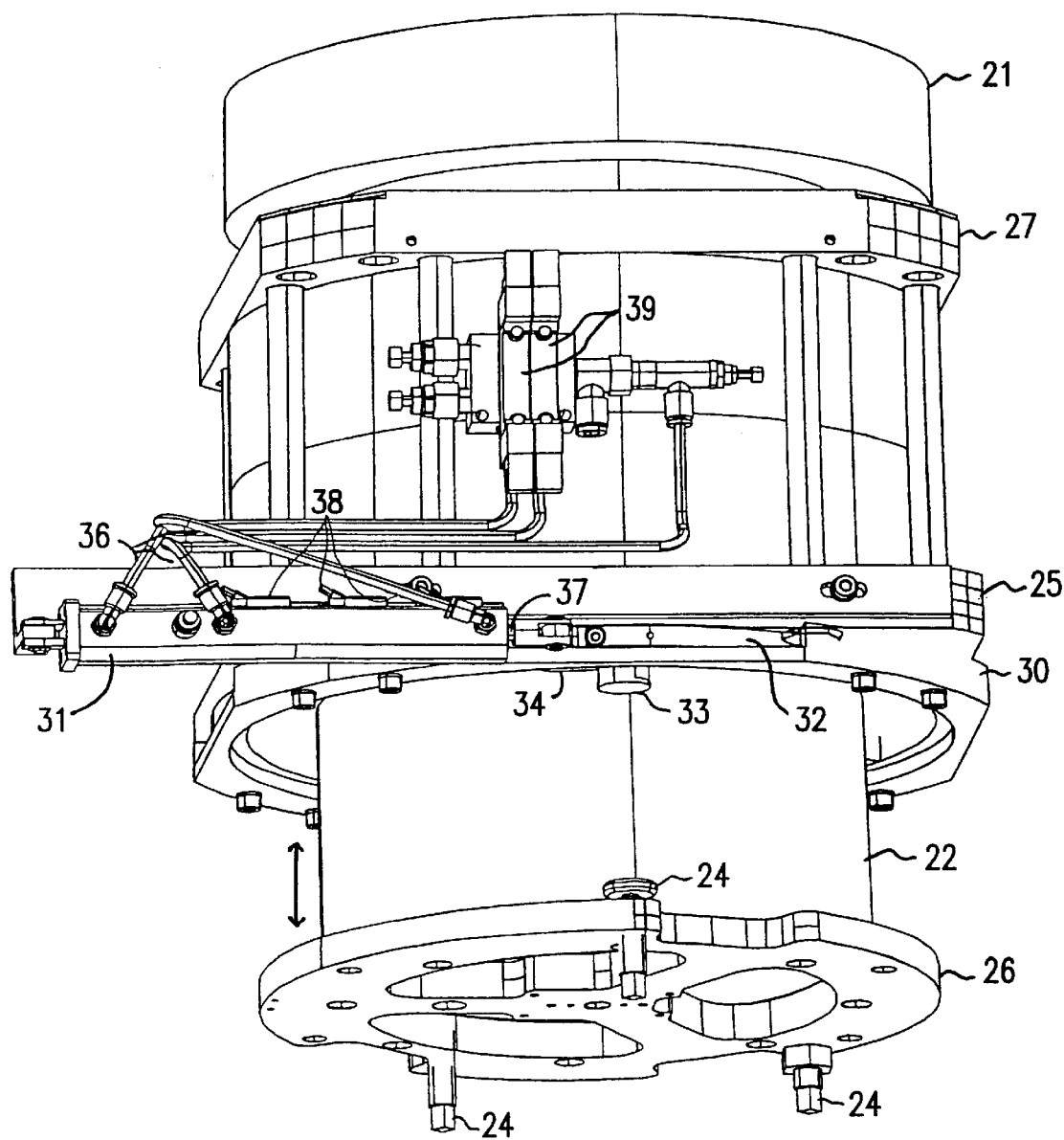
FIG. 3 shows a drive system for a semiconductor support device of the present invention in structural form.

Referring now to the drawings, wherein like reference numerals designate identical or corresponding parts throughout the several views, and more particularly to FIG. 3, a drive system for a semiconductor support device including a variable gap stop arrangement of the present invention is shown.

Figure 1:
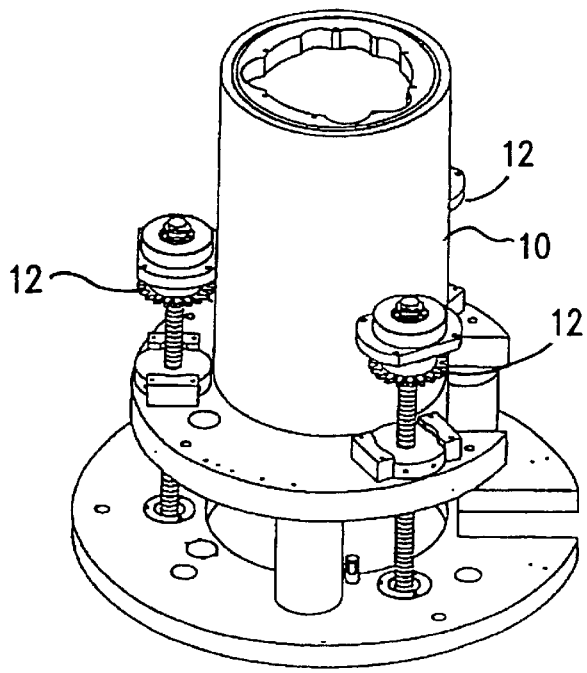
FIG. 1 shows a background chain drive system for a semiconductor support device.
Figure 2:
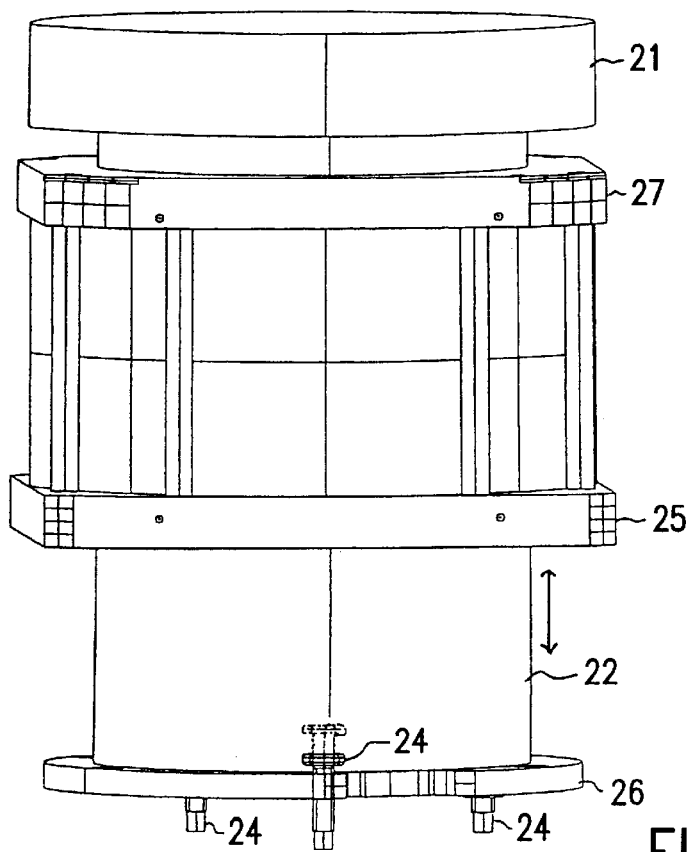
FIG. 2 shows a further background drive system for a semiconductor support device.
Figure 5:
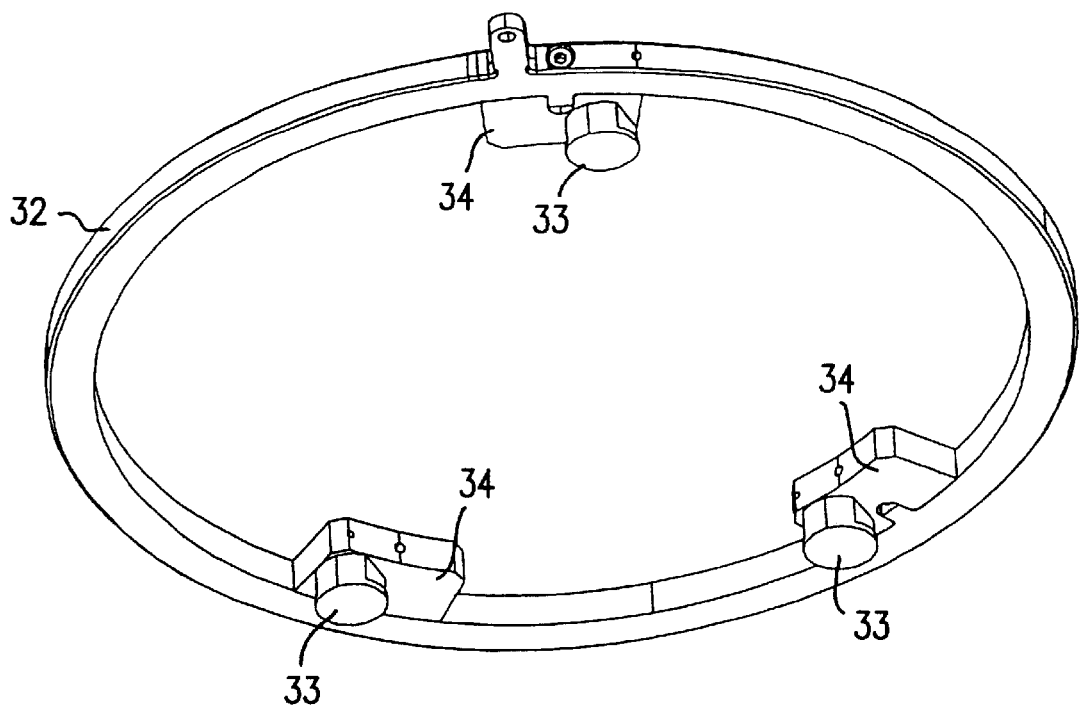
FIG. 5 shows one specific element of a variable gap stop system of the present invention.

The system for the present invention as shown in FIG. 3 is similar to the system of FIG. 2 in that a chuck 21 is mounted on and positioned by a cylinder 22. The cylinder 22 in turn has mounted thereto a lower base 26 which includes stop screws 24. The cylinder 22 is pneumatically controlled to move up and down. However, the system of the present invention as shown in FIG. 3 includes a variable stop gap mechanism which allows the chuck 21 to be placed at variable heights within a processing chamber (not shown). To achieve such an operation, in the present invention as shown in FIG. 3 a ring 32 is provided inside a guide 30. The ring 32 is shown in further detail in FIG. 5. The ring 32 includes various stop surfaces 33, 34 which each have different heights and which may be positioned to move in and out of alignment with, and to thereby contact or not contact, the stop screws 24 of the lower base 26 when the cylinder 22 is moved upward.

The position of the ring 32 can be moved in a circumferential direction by a cylinder 31 with a rod 37. When the ring 32 is moved in a circumferential direction, the ring 32 can be moved so that (1) the bottom of the stop surfaces 33 are positioned in alignment opposite the stop screws 24, (2) the bottom of the intermediate height stop surfaces 34 are positioned in alignment opposite the stop screws 24, or (3) no surface of the ring 32 is positioned opposite the stop screws 24 so that the stop screws 24 will abut against a lower face of the lower bracket 25 when the cylinder 22 is fully moved upward.

In such a way, by changing the position of the ring 32 the cylinder 22 can be stopped at three different positions corresponding to (1) the stop screws 24 abutting against the stop surfaces 33, corresponding to the chuck 21 being positioned at a lowest position within a processing chamber, (2) the stop screws 24 abutting against the stop surfaces 34, corresponding to the chuck 21 being positioned at a relatively intermediate position within a processing chamber, and (3) the stop screws 24 abutting against the lower bracket 25, as in the embodiment of FIG. 2, corresponding to the chuck 21 being positioned at an uppermost position within a processing chamber.

By utilizing such a variable gap stop arrangement as in the present invention, the chuck 21 can be stopped at three different positions within a processing chamber. Moreover, by utilizing such a variable gap stop arrangement as in the present invention the positioning of the stop screws 24 could still be adjusted to change in absolute values the three positions at which the chuck 21 can be positioned within the processing chamber.

In the embodiment shown in FIG. 3 the ring 32 is formed within the guide 30 that is attached to the lower bracket 25. The guide 30 is provided to ensure a smooth movement of the ring 32 in its circumferential direction.

In the embodiment of FIG. 3 the cylinder 31 is provided to position the ring 32 at the three different positions noted above. One cylinder which has been found to achieve such an operation is a tandem cylinder with options XC11 or XC12 manufactured under the name Global Series™ air cylinders. Such a cylinder 31 may be a tandem cylinder which is used when three distinct rod positions are required. The cylinder 31 may be formed of two cylinders assembled tip-to-tail with bolts threaded into rear tap mounting holes of the forward cylinder. Such a cylinder with two different strokes, in which the shorter stroke is located on the rear cylinder, enables a single rod 37 to not be extended, to be extended to a positive intermediate position, or to be extended to a full extension.

The cylinder 31 may be an air driven cylinder which is supplied air by various air lines 36. The air supply to the cylinder 31 is controlled by solenoid valves 39 which, by controlling the supply of air in the air lines 36, control the operation of the three position cylinder 31.

As also shown in FIG. 3, mounted on the cylinder 31 are three sensors 38. The sensors 38 are provided to monitor the position of the rod 37 of the cylinder 31. The use of the sensors 38 can provide a feedback control to confirm the position of the rod 37 of the cylinder 31, and thus to in turn confirm the position of the ring 32.

Figure 4:
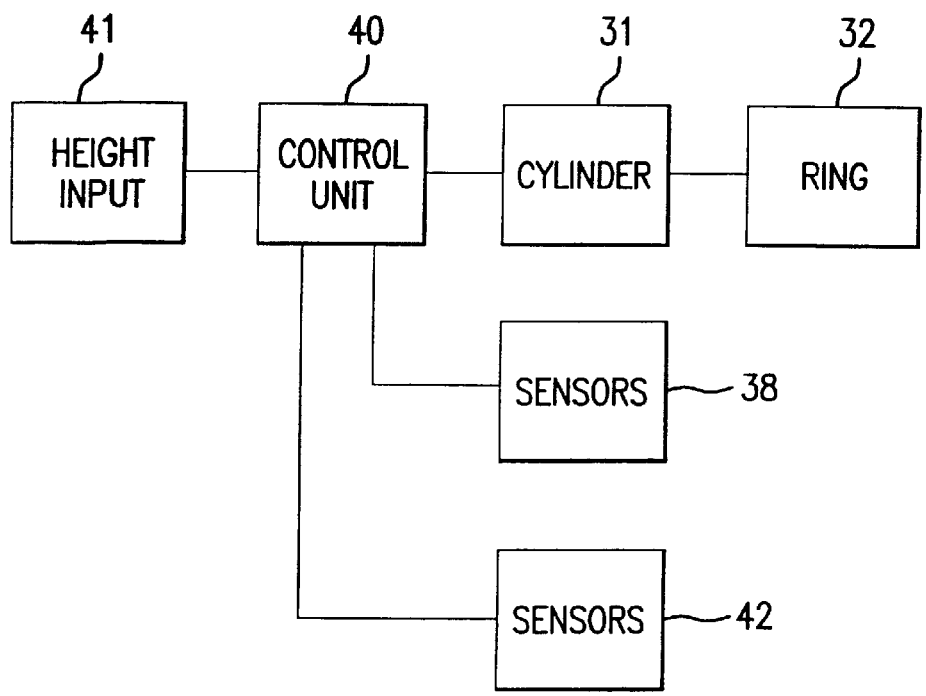
FIG. 4 shows, in block diagram form, specific elements of the drive system for the semiconductor support device of the present invention.

FIG. 4 shows an overall block diagram of the control system of the present invention.

As shown in FIG. 4, the cylinder 31 controls the position of the ring 32. The cylinder 31 in turn is controlled by a control unit 40. The control unit 40 receives a height input 41, which typically will be provided by an operator inputting the desired height of the chuck 21 within a processing chamber on a keypad, touchscreen, etc. When the control unit 40 receives the height input 41 the control unit 40 controls the cylinder 31 to extend the rod 37 to a desired position, and the cylinder 31 thereby controls the ring 32 to move circumferentially to the desired position. The control unit 40 also receives feedback signals from the sensors 38. As noted above, the sensors 38 are sensors which confirm the position of the rod 37 within the cylinder 31. That way the control unit 40 can confirm that the rod 37 within the cylinder 31 is at the desired position.

Also, the control unit 40 can receive signals from a second set of sensors 42 which can be provided within the processing chamber or adjacent to the cylinder 22 and which sense a position of the chuck 21 within the processing chamber or a position of the cylinder 22. The sensors 42 should be provided at each of the three heights the chuck 21 can be positioned at within the processing chamber in the example of the present embodiment. Those sensors 42 can provide an additional way that the control unit 40 can confirm the position of the chuck 21 within the processing chamber.

Figure 6:
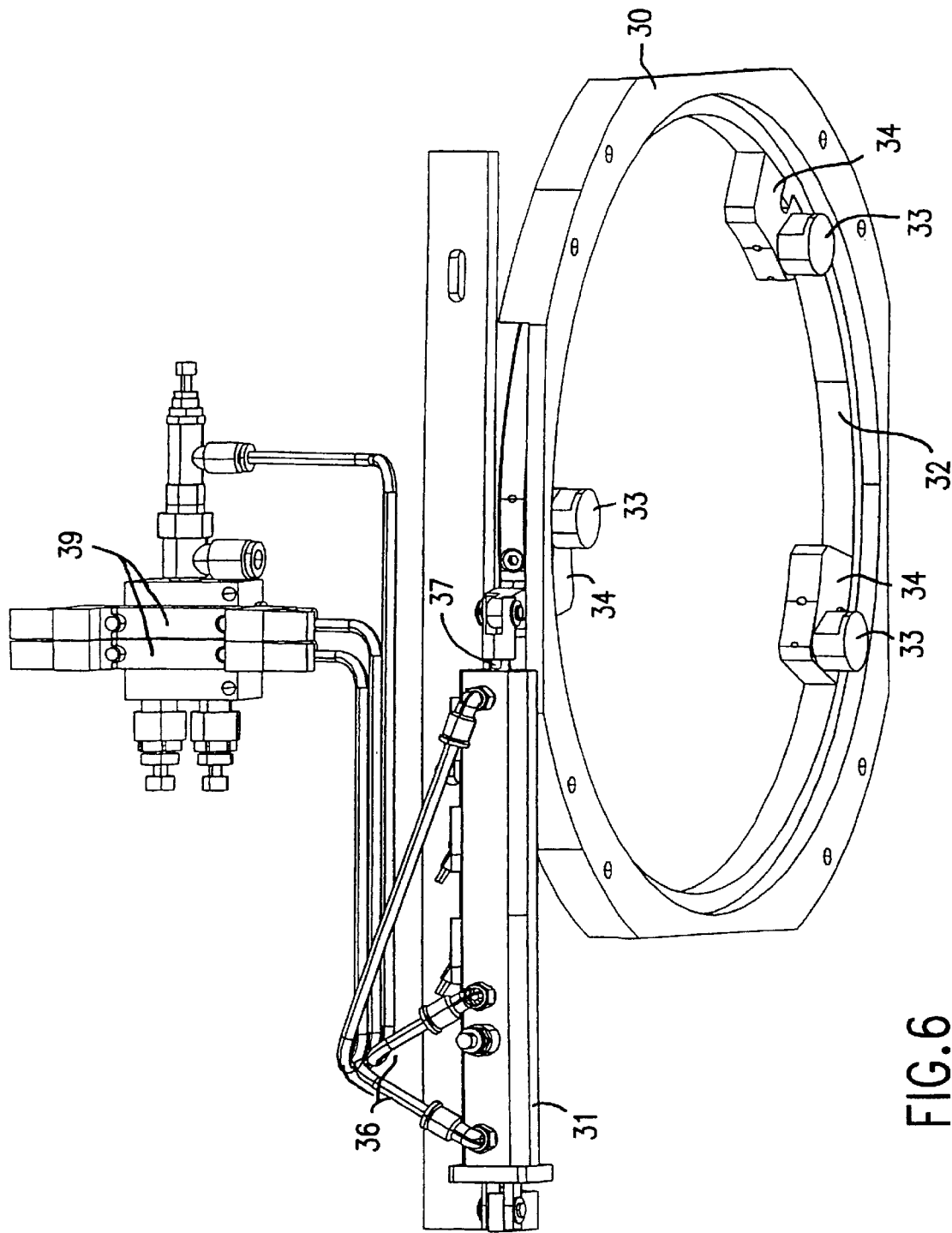
FIG. 6 shows the variable gap stop system of the present invention at a first position.
Figure 7:
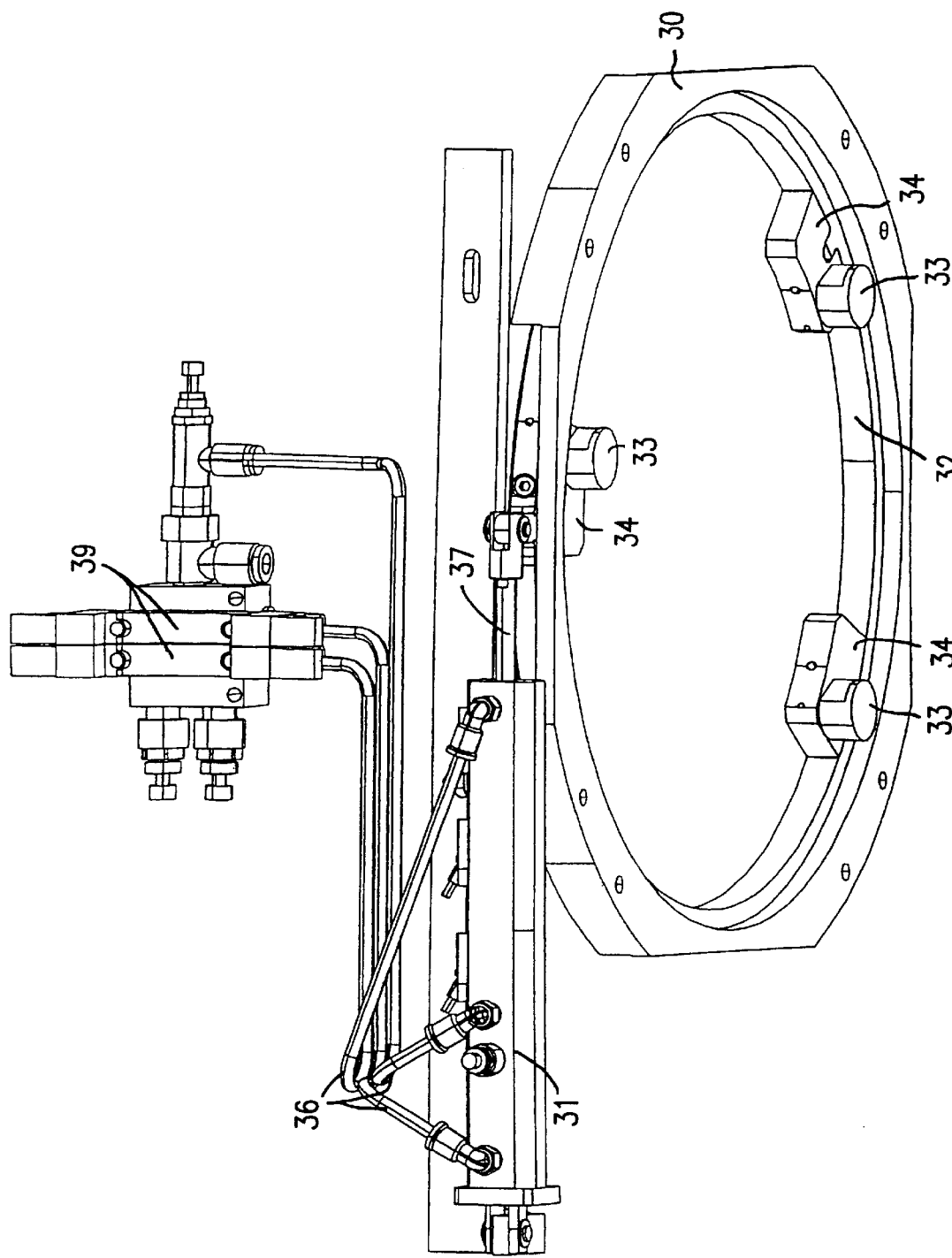
FIG. 7 shows the variable gap stop system of the present invention at a second position.
Figure 8:
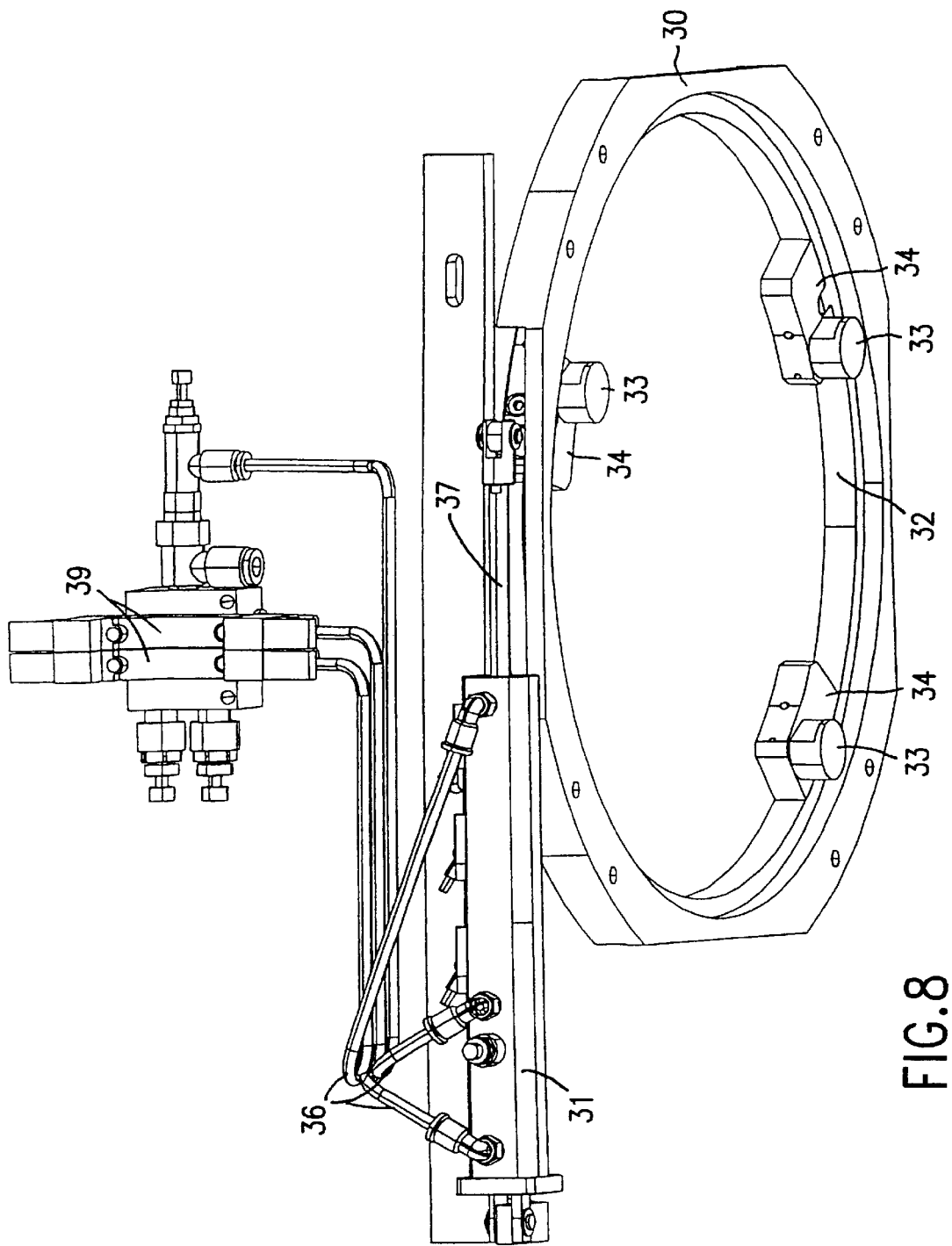
FIG. 8 shows the variable gap stop system of the present invention at a third position.

FIGS. 6–8 show the variable gap stop system in isolation and respectively show the three different positions that the ring 32 can take.

More specifically, FIG. 6 shows the variable gap stop system of the present invention in isolation in which the rod 37 of the cylinder 31 is not extended so that the cylinder 31 is at a position such that the stop surfaces 33 of the ring 32 are positioned in alignment with the screw stops 24. With the positioning as shown in FIG. 6, when the cylinder 22 is raised up to a position such that a semiconductor wafer mounted on the chuck 21 is within the processing chamber, the stop screws 24 mounted on the lower base 26 of the cylinder 22 will abut against the stop surfaces 33 of the ring 32 to stop the movement of the cylinder 22. As discussed above, in such a position the chuck 21 will be at its lowest position within the processing chamber.

FIG. 7 shows the variable gap stop system of the present invention in which the rod 37 of the cylinder 31 is extended to an intermediate position. In the position as shown in FIG. 7 the stop surfaces 34 of the ring 32 are positioned in alignment with the screw stops 24. In that operation, when the cylinder 22 is raised up the top of the screw stops 24 will abut against the intermediate stop surfaces 34 so that the chuck 21 will be positioned at an intermediate position within the processing chamber.

FIG. 8 shows the variable gap stop system of the present invention in which the rod 37 of the cylinder 31 is extended to a maximum level such that no portion of the ring 32 is aligned with the screw stops 24. In that position as shown in FIG. 8, when the cylinder 22 is raised up the top of the screw stops 24 will abut against the bottom of the lower bracket 25. In that position the chuck 21 will be at its highest level within the processing chamber.

Thus, with the operation of the present invention as shown in the above-noted figures the chuck 21 can be controlled to take on various height positions within a processing chamber.

The embodiment of the present invention as discussed above shows a ring 32 including two different stop surfaces 33 and 34 so that three different gap stop positions or heights are available. The ring 32 could clearly be modified to include only one gap stop surface or three or more gap stop surfaces as desired.

Moreover, the stop surfaces 33 and 34 can either be formed as integral portions with the ring 32, or can be formed as distinct elements which attach to the ring 32. If the stop surfaces 33 and 34 are formed as distinct elements which attach to the ring 32, then it is possible that different stop surfaces 33 and 34 can be utilized. That is, different sets of stop surfaces 33 and 34 of various heights could be selected and incorporated into the ring to increase the flexibility of the device of the present invention.

Moreover, the cylinder 31 need not be an air driven cylinder but could be any cylinder which can move the ring 32 to various positions.

Moreover, the gap stop surfaces 33, 34 have been shown as part of a ring 32, but the gap stop surfaces 33, 34 could be formed on a non-circumferential device as desired.

The present invention has also been discussed above with respect to a variable gap stop arrangement utilized in a semiconductor processing device. The present invention could of course be used in other types of devices, but the applicants of the present invention have recognized that such a device in the present invention may be particularly useful in semiconductor processing equipment.

Obviously, numerous additional modifications and variations of the present invention are possible in light of the above teachings. It is therefore to be understood that within the scope of the appended claims, the present invention may be practiced otherwise than as specifically described herein.

What is claimed is:

1. A variable gap stop device for stopping movement of a drive unit including at least one positioning surface, comprising:
    a movable gap stop unit including at least first and second stop surfaces each at a different height;
    a cylinder configured to move said moveable gap stop unit to position said at least first and second stop surfaces to be in and out of alignment of a position to contact at least one positioning surface of the drive unit.

2. A variable gap stop device according to claim 1, wherein said moveable gap stop unit includes a ring shaped member supporting said at least first and second stop surfaces, and said cylinder moves said ring shaped member in a circumferential direction.

3. A variable gap stop device according to claim 1, wherein said cylinder comprises a tandem cylinder with a rod connected to said moveable unit, and said rod can take three different positions.

4. A variable gap stop device according to claim 3, further comprising at least one sensor on said cylinder configured to detect a position of said rod.

5. A semiconductor processing device, comprising:
    a support on which a semiconductor wafer to be processed is placed;
    a drive unit configured to position said support at a height within a processing chamber, said drive unit including at least one positioning surface;
    a movable gap stop unit including at least first and second stop surfaces each at a different height; and
    a cylinder configured to move said moveable gap stop unit to position said at least first and second stop surfaces to be in or out of alignment of a position to contact said at least one positioning surface of said drive unit.

6. A semiconductor processing device according to claim 5, wherein said moveable gap stop unit includes a ring shaped member supporting said at least first and second stop surfaces, and said cylinder moves said ring shaped member in a circumferential direction.

7. A semiconductor processing device according to claim 5, wherein said cylinder comprises a tandem cylinder with a rod connected to said moveable unit, and said rod can take three different positions.

8. A semiconductor processing device according to claim 7, further comprising at least one sensor on said cylinder configured to detect a position of said rod.

9. A semiconductor processing device, comprising:

support means for supporting a semiconductor wafer to be processed;

drive means for driving said support means to a height within a processing chamber, said drive means including at least one positioning surface means;

variable gap stop means for including at least first and second stop surface means each at a different height; and positioning means for positioning said variable gap stop means to position said at least first and second stop surface means to be in or out of alignment of a position to contact said positioning surface means of said drive means.

10. A semiconductor processing device according to claim 9, further comprising at least one sensor means on said positioning means for detecting a position that said positioning means positions said variable gap stop means.

11. A process for stopping movement of a drive unit including at least one positioning surface, comprising the steps of:

providing a movable gap stop unit including at least first and second stop surfaces each at a different height;

moving said moveable gap stop unit to position said at least first and second stop surfaces to be in and out of alignment of a position to contact the at least one positioning surface of the drive unit.

12. A process according to claim 11, wherein the moveable gap stop unit includes a ring shaped member supporting the at least first and second stop surfaces, and the moving step moves the ring shaped member in a circumferential direction.

13. A process according to claim 11, wherein the drive unit includes a support on which a semiconductor wafer to be processed is placed which is positioned at a height within a processing chamber.

14. A process according to claim 13, wherein the at least one stop surface of the moveable gap stop unit includes at least first and second stop surfaces each at a different height.

15. A process according to claim 13, wherein the moveable gap stop unit includes a ring shaped member supporting the at least first and second stop surfaces, and the moving step moves the ring shaped member in a circumferential direction.

* * * * *